(12) United States Patent
Sugiyama et al.

(10) Patent No.: US 7,805,123 B2
(45) Date of Patent: Sep. 28, 2010

(54) RF TRANSCEIVER USING HOPPING FREQUENCY SYNTHESIZER

(75) Inventors: Yoshikazu Sugiyama, Kamakura (JP); Isao Ikuta, Yokohama (JP); Yusaku Katsube, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 830 days.

(21) Appl. No.: 11/737,802

(22) Filed: Apr. 20, 2007

(65) Prior Publication Data

US 2007/0189361 A1    Aug. 16, 2007

(30) Foreign Application Priority Data

Apr. 21, 2006    (JP) ............... 2006-117645

(51) Int. Cl.
H04B 1/06    (2006.01)
H04B 7/00    (2006.01)

(52) U.S. Cl. .................. 455/260; 455/182.1; 455/196.1

(58) Field of Classification Search .............. 455/182.1, 455/182.2, 183.1, 183.2, 192.1, 192.2, 192.3, 455/196.1, 197.1, 209, 255, 256, 257, 258, 455/259, 260

See application file for complete search history.

(56) References Cited

U.S. PATENT DOCUMENTS

2004/0136441 A1 * 7/2004 Ryu et al. .................... 375/135

2009/0304044 A1 * 12/2009 Van De Beek et al. ...... 375/132

FOREIGN PATENT DOCUMENTS

JP    11-243351    9/1999
JP    2000-332539    11/2000

OTHER PUBLICATIONS

A. Ismail, et al.; A 3.1 to 8.2GHz Direct Conversion Receiver for MB-OFDM UWB Communications; IEEE International Solid-State Circuits Conference; ISSCC 2005/Session 11/ Ultra Wideband Solution/ 11.5; 2005; pp. 208-209; Continuations pp. 593.

(Continued)

*Primary Examiner*—Edward Urban
*Assistant Examiner*—Christian A Hannon
(74) *Attorney, Agent, or Firm*—Antonelli, Terry, Stout & Kraus, LLP.

(57) ABSTRACT

A technique of frequency hopping communication capable of high-speed switching of a plurality of signals having ultra-wide band 528 MHz bandwidth at high-speed and setting and switching a band center frequency and the number of bands arbitrary is provided. A radio transceiver has a frequency hopping communication function of UWB system for switching the ultra wide band signal. In the device, high-speed frequency hopping is realized by controlling an SSB mixer in a local oscillator circuit and switching the frequency of a DDS. The device sets NCO data to the DDS and switches a quadrature phase signal of an output, and switches a signal input of an input terminal of the SSB mixer by a control of a phase switching switch. One of a sum component and a difference component of a mixture of first and second quadrature phase signals is outputted from the output terminal of the SSB mixer.

8 Claims, 9 Drawing Sheets

OTHER PUBLICATIONS

3$^{rd}$ Generation Partnership Project; Technical Specification Group Radio Access Networks; User Equipment (UE) radio transmission and reception (FDD) (Release 7); 3GPP TS 25.101; Jun. 2005; pp. 1-120; V7.0.0.

3$^{rd}$ Generation Partnership Project; Technical Specification Group Radio Access Networks; Physical layer procedures (FDD) (Release 6); 3GPP TS 25.214; Sep. 2004; pp. 1-64; V6.3.0.

* cited by examiner

NOMAL MODE

—sin MODE

S1 (0 DEGREE SIGNAL INPUT TERMAINAL 71)

S2 (180 DEGREE SIGNAL INPUT TERMAINAL 72)

S3 (90 DEGREE SIGNAL INPUT TERMAINAL 73)

S4 (270 DEGREE SIGNAL INPUT TERMAINAL 74)

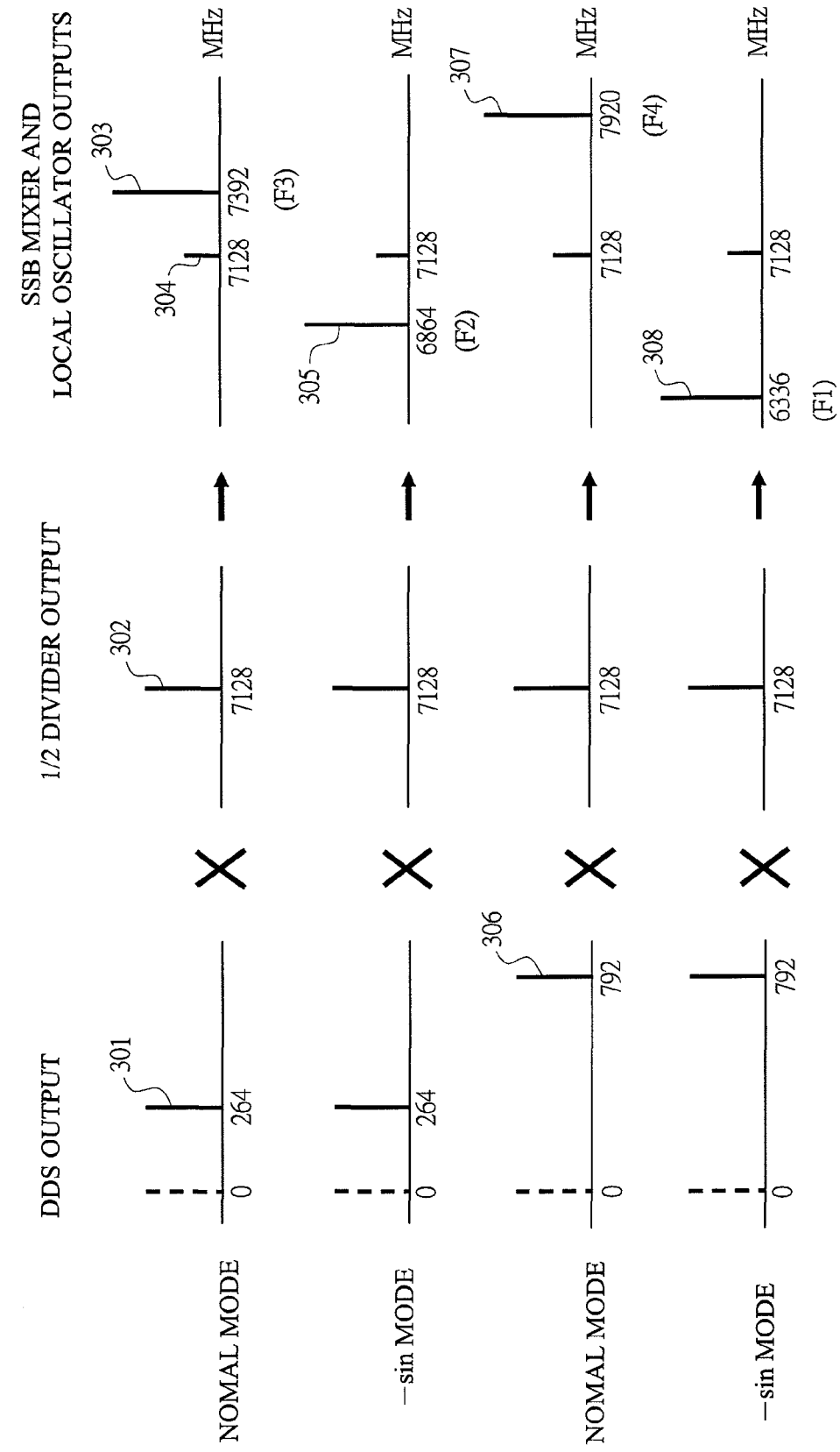

FIG. 4

| FREQUENCY BEFORE SWITCHING | FREQUENCY AFTER SWITCHING | | | |
|---|---|---|---|---|
| | F1 | F2 | F3 | F4 |
| F1 | | Dnco | Dnco | — |
| F2 | Dnco | | —Sin → Nom | —Sin → Nom |
| F3 | Dnco | —Sin → Nom | | —Sin → Nom |
| F4 | — | Nom → —Sin | Dnco | |
| | Nom → —Sin | Nom → —Sin | Dnco | — |

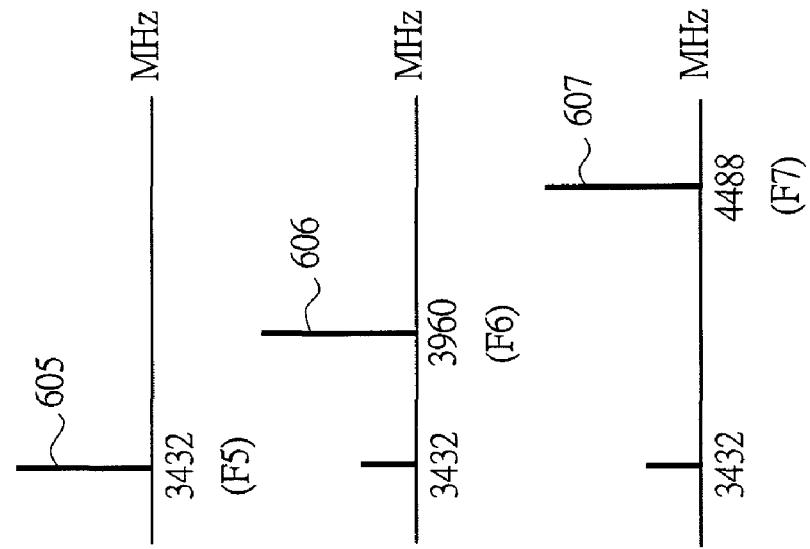
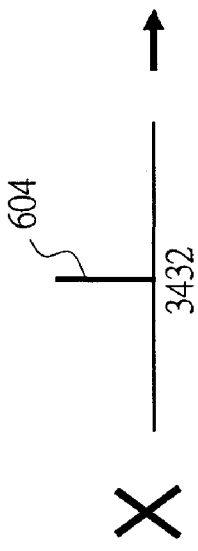
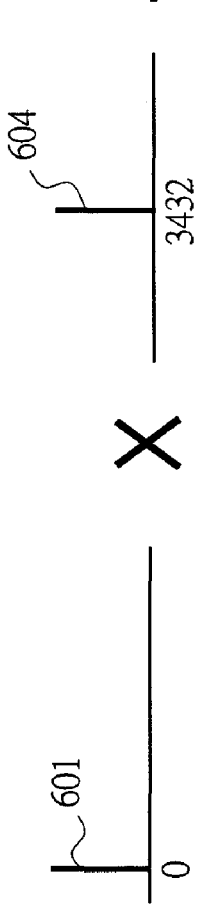

RF TRANSCEIVER USING HOPPING FREQUENCY SYNTHESIZER

CROSS-REFERENCE TO RELATED APPLICATION

The present application claims priority from Japanese Patent Application No. JP 2006-117645 filed on Apr. 21, 2006, the content of which is hereby incorporated by reference into this application.

BACKGROUND OF THE INVENTION

1. Field of the Invention

The present invention relates to a technique of radio transmission and reception of frequency hopping system for performing communication while switching a carrier frequency, more particularly, to a radio transceiver of Ultra Wide Band (UWB) system and an IC in which the signal bandwidth of one frequency band is 528 MHz, namely a wide band (ultra wide band).

2. Related Art

In a wireless local area network (wireless LAN), a system which configures the frequency band of wide band signal using multi-carrier system to make the transmission speed faster and implements frequency hopping of the frequency bands at high speed to spread the signal spectrum has been proposed.

Specifically, the Ultra Wide band (UWB) system using orthogonal frequency division multiplexing (OFDM) for the multi-carrier system has been proposed in the IEEE 802.15a standard of the United States. This UWB is referred to as Multi-band OFDM (MB-OFDM) in Multi-Band OFDM Alliance (MBOA) and is being reviewed for standardization.

The main points of the MB-OFDM technical standard are as follows. (1) The band center frequency interval is Fstep=528 MHz, and includes three bands of 3432 MHz, 3960 MHz, and 4488 MHz in 4 GHz band, and four bands of 6336 MHz, 6864 MHz, 7128 MHz and 7392 MHz in 7 GHz band. (2) These bands are frequency hopped in a frequency transition period of Ttj<9.0 nsec. Accordingly, the radio signal in which the transmission rate is high and the spectrum is spread in ultra wide band is realized.

A conventional art of a frequency oscillator used in this type of UWB transceiver is disclosed in "A 3.1 to 8.2 GHz Direct Conversion Receiver for MB-OFDM UWB Communications, A. Ismail, A. Abidi, 2005 IEEE International Solid-State Circuits Conference, Session 11, 11.5" (Non-patent Document 1) made public in International Solid-State Circuit Conference held on February, 2005 under the auspices of IEEE. This conventional art includes a frequency oscillator, a plurality of frequency dividers, a frequency mixer, and a switchable buffer amplifier, where the signal of abovesaid (1) is frequency transitioned within 9 nsec by repeating addition and subtraction of signals and thereafter, switching to a specific signal and outputting the same.

The conventional art has drawbacks in that: (1) the hopping frequency obtained in the oscillator is a fixed frequency and thus does not have degree of freedom in terms of communication system; and (2) a radio frequency oscillator of 16 GHz is required.

On the contrary, frequency oscillators used in a radio transceiver includes: (1) a frequency synthesizer; and (2) a direct digital synthesizer (DDS). The system of (1) is a system of configuring a phase locked loop (PLL) by: a voltage control oscillator (VCO); a phase comparator; and a programmable divider, and obtaining the target frequency. The system of (2) is a system of obtaining a frequency set by outputting data to a digital/analog converter (DAC) from a numeral controlled oscillator (NCO), which is a ROM storing sine waves.

The conventional art related to the DDS is disclosed in Japanese Patent Application Laid-Open Publication No. 2000-332539 (Patent Document 1).

When considering applications of the DDS to a frequency hopping system of wide band such as MB-OFDM, there were problems in that: (1) a carrier frequency transition of wide band (e.g., 528 MHz) cannot be performed; and (2) the carrier frequency cannot be switched at high speed.

Other techniques of radio communication system, for example, the radio property specification and Layer 1 specification of the WCDMA system are respectively defined in "Technical Specification Group Radio Access Networks; UE radio transmission and reception (FDD) (Release 7), 3GPP TS 25.101 v7.0.0 (2005-06), URL: www.3gpp.org/specs/specs.htm" (Non-patent Document 2) and "Technical Specification Group Radio Access Networks; Physical layer procedures (FDD) (Release 6), 3GPP TS 25.214 v6.3.0 (2004-09), URL: www.3gpp.org/specs/specs.htm" (Non-patent Document 3), released by the 3GPP.

3. SUMMARY OF THE INVENTION

The conventional art had the abovesaid problems. A system or technique of frequency hopping communication capable of switching among a plurality of signals having a bandwidth of 528 MHz and the like at high rate (e.g., 9 nsec) is desired.

In view of the above problems, the present invention aims to solve the above problems and provide a technique of frequency hopping communication capable of switching (frequency hopping) among a plurality of signals having a bandwidth (band) of ultra wide band at high rate and capable of freely and arbitrarily selecting and setting to switch the band center frequency and the number of bands.

The typical ones of the inventions disclosed in this application will be briefly described as follows. In order to solve the above problems, the present invention provides a technique of radio transmission and reception having a communication function of frequency hopping system, and having the following features.

(1) <Configuration of Switching Normal Mode and −sin Mode>

A device (frequency hopping communication IC) of the present invention includes: a direct digital synthesizer (DDS); a single side band mixer (SSB mixer); a fixed frequency oscillator; and a phase switching unit. The DDS outputs four signals (quadrature phase signal) of 0 degree (I), 90 degree (Q), 180 degree (IB), and 270 degree (QB) whose phases differ by 90 degrees from an output terminal at a frequency (band center frequency: F) based on a frequency setting parameter in synchronization with a reference clock. The SSB mixer inputs quadrature phase signals to both an RF input (input terminal of a first quadrature phase signal, first type of input terminal) and a local oscillation signal input terminal (input terminal of a second quadrature phase signal, second type of input terminal), and outputs only one of a sum component frequency or a difference component frequency as an output frequency to an output terminal.

The DDS outputs the first quadrature phase signal to the radio frequency signal input terminal (RF input) of the SSB mixer. The fixed frequency oscillator (and 1/2 frequency divider etc.) outputs the second quadrature phase signal to the local oscillation signal input terminal of the SSB mixer.

In other words, the phase switching unit is a phase switching means or circuit of the quadrature phase signal. The phase switching unit switches the signal phase or the input/output path between the DDS (output terminal thereof) and the SSB mixer (RF input thereof) so that the 90 degree signal of the first quadrature phase signal of the output of the DDS is outputted to the input terminal (fourth input terminal) of the 270 degrees signal of the SSB mixer, and the 270 degrees signal of the same output of the DDS is outputted to the input terminal (third input terminal) of the 90 degree signal of the SSB mixer. Between the DDS and the SSB mixer, each signal of the four phases of the first quadrature phase signal is outputted to the input terminal of the corresponding phase when the switching by the phase switching unit is in the forward state, and the 90 degrees signal and the 270 degrees signal are outputted to the input terminal having the phase of 180 degrees opposite when the switching is in a reverse state.

When switching the output frequency of the SSB mixer (Fssb), the present device switches the output frequency of the DDS (Fdds) and simultaneously controls switching of the phase switching unit (switching from forward to reverse, or vice versa) to switch the output frequency of the SSB mixer from the sum component frequency to the difference component frequency, or from the difference component frequency to the sum component frequency. By this means, switching a plurality of frequencies (ultra wide signal) at high speed, that is, frequency hopping is realized.

The present device is configured as described below. N bands of F1 to FN are provided as usable frequencies (band center frequencies), and an interval of the band center frequency F is assumed as Fstep.

If N=even number (e.g., four bands), the frequency Ffix of the fixed frequency oscillator is Ffix=Σ(Fn)/N, where the output frequency of the DDS Fdds is Fdds=1/2×Fstep+m×Fstep (m=0, 1, . . . , N/2−1).

If N=odd number (e.g., three bands), the frequency Ffix is Ffix=Σ(Fn)/N−Fstep, where the output frequency Fdds is Fdds=1/2×Fstep+m×Fstep (m−1, . . . , (N−1)/2).

In the above frequency setting, the output frequency of the SSB mixer (Fssb) is switched by switching the signal phase by the phase switching unit simultaneously with switching the output frequency of the DDS (Fdds).

(2) <Configuration of Switching DC Voltage and DDS Frequency>

The present device may have another configuration such as described below. The SSB mixer operates so that the output frequency (second quadrature phase signal) of the fixed frequency oscillator is outputted to the output terminal when the output of the DDS is direct current. N bands of F1 to FN are provided as usable frequencies, and the interval of the band center frequency F is assumed as Fstep.

The frequency Ffix of the fixed frequency oscillator is Ffix=F1, and the output frequency of the DDS is Fdds=0 [Hz] (N=1), Fdds=N×Fstep (N≠1).

In the above frequency setting, the output frequency of the SSB mixer (Fssb) is switched by switching the output frequency of the DDS (Fdds).

(3) <Complex Communication Device with Division Multiple Access Method>

The present device may have still another configuration such as described below. The present device is an integrated communication device including a communication function (e.g., WCDMA correspondence) in one of the division multiple access method of TDMA, FDMA, CDMA in addition to the communication function (e.g., UWB correspondence) of frequency hopping system of ultra wide band signal such as above (1) and (2).

The present device includes: a numeral controlled oscillator (NCO); an SSB mixer; the fixed frequency oscillator; a digital modulator; a D/A converter; an A/D converter; a digital demodulator; an n-phase inverse mapping circuit; and a frequency switching circuit.

The NCO outputs amplitude data of a frequency based on a frequency setting parameter in synchronization with a reference clock. The SSB mixer inputs a quadrature phase signal to both an RF input (first input terminal) and a local oscillation signal input terminal (second input terminal), and outputs only one of a sum component frequency or a difference component frequency to an output terminal. The fixed frequency oscillator outputs a second quadrature phase signal to the local oscillation signal input terminal of the SSB mixer.

The n-phase mapping circuit converts an n-phase modulated I signal and an n-phase modulated Q signal to I data and Q data for modulating the output of the NCO based on transmitted data. The digital modulator modulates the output of the NCO by the I data and Q data of the output of the n-phase mapping circuit. The D/A converter converts a digital signal output from the digital modulator to an analog signal, and outputs the analog signal to the first input terminal of the SSB mixer.

The A/D converter samples an input signal (received IF signal). The digital demodulator demodulates an output of the A/D converter to the output of the NCO. The n-phase inverse mapping circuit converts the I data and the Q data outputted from the digital demodulator to an n-phase modulated I signal and an n-phase modulated Q signal.

The frequency switching circuit switches the output of the fixed frequency oscillator by a control signal and output the same to the second input terminal of the SSB mixer.

In the present device, regarding reception of the communication of division multiple access system, the frequency of the NCO is set, a signal of the division multiple access system is sampled by the A/D converter, the sampled signal is mixed with the output of the NCO to be demodulated by the digital demodulator, and the demodulated I data and the Q data are inverse mapped to the n-phase modulated I signal and the Q signal by the n-phase inverse mapping circuit.

In the present device, regarding transmission of the communication of division multiple access system, the modulated signal of the division multiple access system is mapped to the I data and the Q data by the n-phase mapping circuit, the output of the NCO is modulated by the I data and the Q data by the digital modulator, the modulated digital signal is converted to an analog signal by the D/A converter, and the converted signal is mixed with the output signal of the fixed frequency oscillator and outputted by the SSB mixer.

In the present device, when switching from the communication of division multiple access system to the communication of frequency hopping system, the frequency of the fixed frequency oscillator is set, the frequency (or input/output path) is switched by the frequency switching circuit, and the output frequency of the NCO is switched, so that the output frequency of the SSB mixer is switched.

The effects obtained by typical aspects of the present invention will be briefly described below. According to the present invention, it is possible to obtain techniques such as a system of frequency hopping communication, a communication device thereof and an IC thereof which are capable of switching (hopping) a plurality of signals having a bandwidth

BRIEF DESCRIPTIONS OF THE DRAWINGS

FIG. 3A is a diagram showing signal spectrums of DDS output in a radio transceiver and a system of the first embodiment of the present invention;

FIG. 3B is a diagram showing signal spectrums of a 1/2 frequency divider output in the radio transceiver and the system of the first embodiment of the present invention;

FIG. 3C is a diagram showing signal spectrums of the SSB mixer and a local oscillator circuit output in the radio transceiver and the system of the first embodiment of the present invention;

FIG. 4 is a diagram showing a data setting operation in frequency switching and a switch switching operation in the radio transceiver and the system of the first embodiment of the present invention;

FIG. 6A is a diagram showing signal spectrums of DDS output in a radio transceiver and a system of the second embodiment of the present invention;

FIG. 6B is a diagram showing signal spectrums of 1/2 frequency divider output in the radio transceiver and the system of the second embodiment of the present invention;

FIG. 6C is a diagram showing signal spectrums of the SSB mixer and the local oscillator circuit output;

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

A first embodiment of the present invention will be described with reference to FIGS. 1 to 4. A radio transceiver of the first embodiment is a device having a radio transmission and reception function and a frequency hopping communication function responding to the UWB radio communication system.

<Device Configuration>

Figure 1:
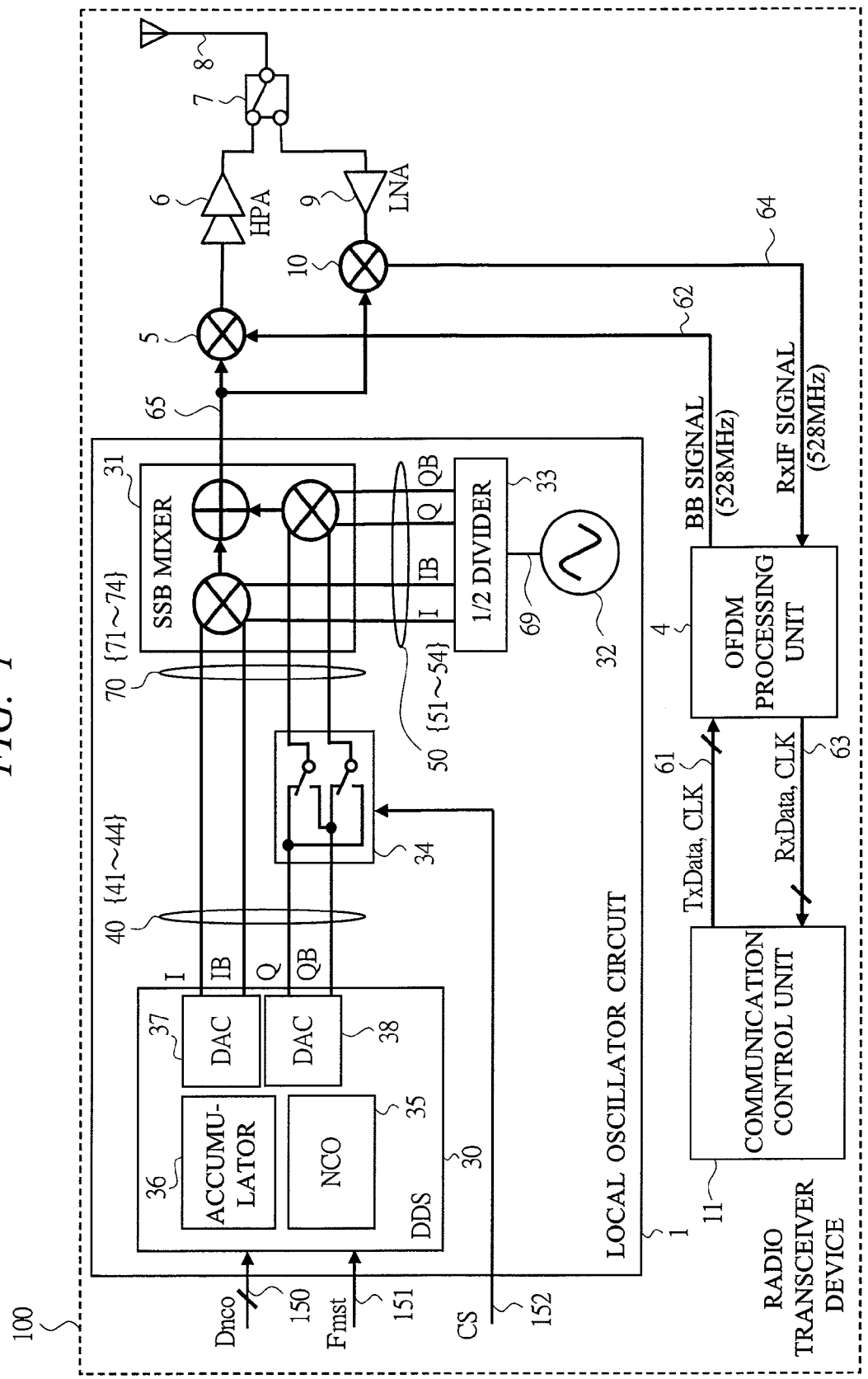
FIG. 1 is a diagram showing a configuration of a radio transceiver in a first embodiment of the present invention.

FIG. 1 shows a configuration of a radio transceiver (communication device) 100 of the first embodiment. The radio transceiver 100 includes a frequency hopping communication IC as a distinguishing circuit. A local oscillator circuit 1 and a portion of a circuit including the local oscillator circuit 1 (e.g., circuit including up to a modulator 5 and a mixer 10) are mounted as one frequency hopping communication IC. The present device has a configuration capable of setting and switching an arbitrary output frequency and the number of bands by setting to a DDC 30 and switching of an input (signal phase) of an SSB mixer 31 in the local oscillator circuit 1.

In FIG. 1, the radio transceiver 100 includes the local oscillator circuit (local oscillator) 1, an OFDM processing unit 4, the modulator 5, a high power amplifier (HPA) 6, a transmit/receive switching switch 7, an antenna 8, a low noise amplifier (LNA) 9, the mixer 10, and a communication control unit (communication processing unit) 11. The local oscillator 1 includes the DDS 30, the SSB mixer 31, a fixed frequency oscillator 32, a 1/2 frequency divider 33, and a phase switching switch 34. The DDS 30 includes an NCO (numeral controlled oscillator) 35, an accumulator 36, and DACs (Digital/Analog converters) 37 and 38. The SSB mixer 31 is a known mixer (mixer).

The communication control unit 11 performs a communication controlling process in the present device, and controls the OFDM processing unit 4 and the local oscillator circuit 1, etc. The OFDM processing unit 4 performs an OFDM transformation/inverse transformation process. The modulator 5, to which a signal from the OFDM processing unit 4 and a signal from the local oscillator circuit 1 are inputted and modulated outputs the result to the HPA 6. The HPA 6 amplifies the signal and outputs the resultant signal to the antenna 8 side. The transmit/receive switching switch 7 switches signal transmission/reception to the antenna 8. The LNA 9 amplifies the signal from the antenna 8 with low noise and outputs the result to the mixer 10. The mixer 10 mixes the signal from the LNA 9 with a signal from the local oscillator circuit 1, and outputs the result to the OFDM processing unit 4. The local oscillator circuit 1 is a local signal source.

The signal/data related to the radio transmission and reception mainly includes transmit data 61, a transmit base band signal 62, receive data 63, a receive base band signal 64, a UWB carrier frequency signal 65 and the like. The UWB carrier frequency signal 65 is the output signal of the local oscillator circuit 1 or the SSB mixer 31, and is outputted to the modulator 5. The signal sent from the modulator 5 to the HPA 6 is an UWB transmit signal, and the signal sent from the transmit/receive switching switch 7 to the LNA 9 is an UWB modulated signal.

The transmit data 61 is transmit data (TxData, CLK) before being generated to the transmit base band signal 62 in the OFDM processing unit 4. The transmit base band signal 62 is a signal of UWB system (BB signal, 528 [MHz]) generated from the transmit data 61 by the OFDM processing unit 4. The receive data 63 is receive data (RxData, CLK) generated from the receive base band signal 64 by the OFDM processing unit 4. The receive base band signal 64 is a signal (RxIF signal, 528 [MHz]) obtained by converting the output of the LNA 9 to the base band signal band by the mixer 10.

In addition, the signal/data input, set, or generated to the local oscillator circuit 1 includes NCO data (Dnco) 150, a master clock (Fmst) 151, a channel switching signal (CS) 152 and the like. The NCO data 150 is the data loaded to the accumulator 36 of the DDS 30. The master clock (Fmst) 151 is the clock used in the DDS 30. The channel switching signal (CS) 152 is the signal for controlling a signal path (i.e., phase switching) of the phase switching switch 34. The channel switching signal (CS) 152 is an H (high) level/L (low) level signal, where switching state shown in FIG. 1 is obtained at H level and the reverse switching state is obtained at L level. Note that, the channel referred to herein is the frequency band.

The local oscillator circuit 1 further includes the following. A quadrature phase signal 40 (41 to 44) and a corresponding output terminal are provided as the output signal and terminal of the DDS 30. A quadrature phase signal 50 (51 to 54) and the corresponding output terminal are provided as the output signal and terminal from the fixed frequency oscillator 32 and the 1/2 frequency divider 33 side. The latter quadrature phase signal 50 (51 to 54) also corresponds to the input signal input to the SSB mixer 31 and the input terminal. The fixed frequency signal 69 is an output signal from the fixed frequency oscillator 32 and the 1/2 frequency divider 33.

The quadrature phase signal 40 {0 degree signal 41, 180 degrees signal 42, 90 degrees signal 43, 270 degrees signal 44} include signals of 0 degree, 180 degrees, 90 degrees, and 270 degrees of sine wave of arbitrary frequency output from the DDS 30, and are referred to as I (In-phase) signal, IB (In-phase Bar) signal, Q (Quad-phase) signal, and QB (Quad-phase Bar) signal. Similarly, the quadrature phase signal 50 {0 degree signal 51, 180 degrees signal 52, 90 degrees signal 53, 270 degrees signal 54} include signals of 0 degree (I), 180 degrees (IB), 90 degrees (Q), and 270 degrees (QB) of sine wave of arbitrary frequency output from the 1/2 frequency divider 33. In the DDS 30, a first DAC 37 outputs the 0 degree signal 41 from a positive phase output terminal, and outputs the 180 degrees signal 42 from a negative phase output terminal. A second DAC 37 outputs the 90 degrees signal 43 from a positive phase output terminal, and outputs the 270 degrees signal 44 from a negative phase output terminal.

The input/output terminals and signals of the SSB mixer 31 include a first (first type) input terminal (quadrature phase signal input terminal) and signal (70), and a second (second type) input terminal (quadrature phase signal input terminal) and signal (50), and an output terminal and signal (65). The first input terminal 70 of the SSB mixer 31 has four input terminals for inputting four signals (quadrature phase signal 40) from the DDS 30 and the phase switching switch 34 side. In other words, the first input terminal 70 is an RF input. The second input terminal (50) of the SSB mixer 31 has four input terminals for inputting four signals (quadrature phase signal 50) from the fixed frequency oscillator 32 and the 1/2 frequency divider 33 side. In other words, the second input terminal (50) is a local oscillation signal input terminal. The output terminal of the SSB mixer 31 is an intermediate frequency signal output terminal, and outputs the UWB carrier frequency signal 65.

The first type input terminal 70 of the SSB mixer 31 includes a first input terminal (I signal input terminal) 71, a second input terminal (IB signal input terminal) 72, a third input terminal (Q/QB signal input terminal) 73, and a fourth input terminal (QB/Q signal input terminal) 74. The input signals of the first type input terminal 70 are signals after the four signals (quadrature phase signal 40) from the DDS 30 side have passed the phase switching switch 34. Similarly, the second type input terminals of the SSB mixer 31 include first to fourth input terminals corresponding to each signal of the quadrature phase signal (50).

The output frequency of the DDS 30 is referred to as Fdds, the output frequency of the fixed frequency oscillator 32 is referred to as Ffix, the output frequency of the 1/2 frequency divider 33 is referred to as Fdiv, and the output frequency of the SSB mixer 33 is referred to as Fssb.

<UWB and Output Frequency>

A setting of the output frequency in the UWB system will now be described. The main elements of the UWB system are as follows. The band center frequency [MHz] has four bands {6336, 6864, 7392, 7920} in group C, and three bands {3432, 3960, 4488} in group A. The primary modulation scheme is QPSK. The secondary modulation scheme is OFDM. The frequency hopping transition time Thop [nsec] is shorter than or equal to 9.0.

The number of used bands N is N=4 in 7 GHz band of UWB, and each band center frequency (F) is defined as F1=6336 MHz, F2=6864 MHz, F3=7392 MHz, and F4=7920 MHz. The interval Fstep of the band center frequency (F) is Fstep=528 MHz. In this case, the output frequency Fdiv of the 1/2 frequency divider 33 is obtained as below.

$$Fdiv=\Sigma(Fn)/N=(6336+6864+7392+7920)/4=7128 \text{ [MHz]} \quad (1)$$

Therefore, the output frequency Ffix of the fixed frequency oscillator 32 is oscillated as to obtain an equation (2).

$$Ffix=Fdiv\times 2=14.256 \text{ [GHz]} \quad (2)$$

The output frequency Fdds of the DDS 30 outputs an equation (3) to obtain the frequency F3 of the UWB band.

$$Fdds=|F3-Fdiv|=|7392-7128|=264 \text{ [MHz]} \quad (3)$$

This equation (3) is generalized as equation (4)

$$Fdds=1/2\times Fstep+m\times Fstep \text{ (m=0, 1, ..., N/2-1)} \quad (4)$$

Regarding the method of setting the Fdds, the relationship between the master clock Fmst 151 and the NCO data 150 is as shown in equation (5) if the NCO data length of the accumulator 36 is Racm bit and the NCO data 150 is Dnco (a whole number of 0<Dnco<2Racm).

$$Fdds=(Dnco/2^{Racm})\times Fmst \quad (5)$$

When Racm=24, Fmst=2.6 [GHz], and Fdds=264 [MHz], the value to be set for Dnco is obtained by an equation (6).

$$Dnco=2^{Racm}\times Fdds/Fmst=224\times 264\times 10^6/(2.6\times 10^9)= \\ 1703532.702 \quad (6)$$

Dnco must be a whole number, and thus Dnco=1703532 is set, and an equation (7) is obtained from equation (4).

$$Fdds=(1703532/224)\times 2.6\times 10^9=263.99989\times 10^6 \text{ [Hz]} \quad (7)$$

Thus, the setting is done to the target frequency 264 [MHz] with an error of −110 [Hz] The NCO data (Dnco) 150 is set to a register of 24 bit length, and thus 264 [MHz] becomes bit [23-0]=000110011111111001101100=19FEAC(H) (here, (H) indicates hexadecimal).

The 0 degrees signal 41 to 270 degrees signal 44 of the outputs (quadrature phase signal 40) of the DDS 30 are inputted to the SSB mixer 31 via the phase switching switch 34, and mixed with the 0 degree signal 51 to 270 degrees signal 54 of the outputs (quadrature phase signal 50) of the 1/2 frequency divider 33.

<Waveform of Input Terminals of SSB Mixer>

Figure 2A:
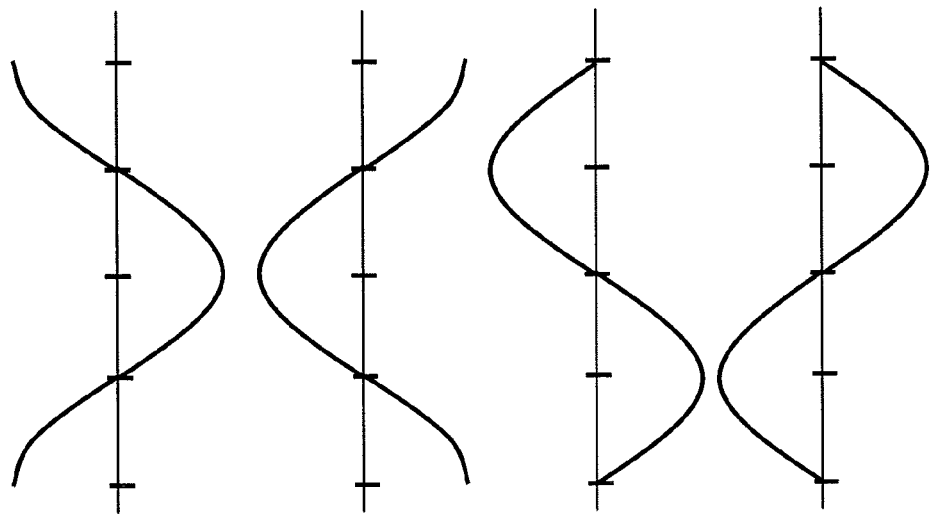
FIG. 2A is a diagram showing signal waveforms of input terminals of quadrature phase signals from a DDS side of an SSB mixer in the radio transceiver of the first embodiment of the present invention.
Figure 2B:
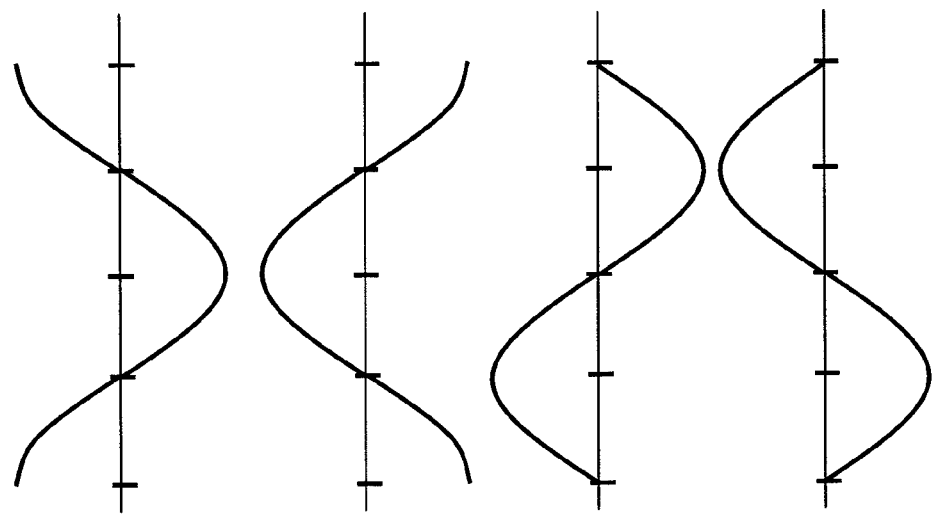
FIG. 2B is a diagram showing signal waveforms of input terminals of quadrature phase signals from the DDS side of the SSB mixer in the radio transceiver of the first embodiment of the present invention.

FIG. 2 shows the waveform of each input terminal 70 (71 to 74) of the SSB mixer 31. In FIG. 2, S1 to S4 are input signal waveforms of the first input terminal (0 degree signal input terminal) 71, the second input terminal (180 degrees signal input terminal) 72, the third input terminal (90 degrees signal input terminal) 73, and the fourth input terminal (270 degrees signal input terminal) 74 of the SSB mixer 31. FIG. 2A shows a "normal mode" described below and FIG. 2B shows a "−sin mode" described below.

When the channel switching signal (CS) 152 is at H (high) level, the phase switching switch 34 operates to connect the 90 degrees signal 43 of the DDS 30 output to the third input terminal (90 degrees input terminal) 73 of the SSB mixer 31 and the 270 degrees signal 44 of the DDS 30 output to the fourth input terminal (270 degrees input terminal) 74 of the SSB mixer 31. Such connection state is referred to as the "normal mode."

In the normal mode, other input terminals (72, 73, 74) each have a phase difference of 180 degrees, 90 degrees, and 270 degrees with respect to the signal phase of the first input terminal (0 degree signal input terminal) 71. That is, if the first input terminal (0 degree signal input terminal) 71 is a cosine signal, the third input terminal (90 degrees signal input terminal) 73 will be a sine signal. The input signals (71 to 74) are thus respectively referred to as I signal, IB signal, Q signal, and QB signal, as described above.

The output frequency Fssb of the SSB mixer 31 of FIG. 1 is obtained as an equation (8).

$$Fssb=Fdiv+Fdds=7128\times10^6+263.99989\times10^6=7391.99989\times10^6\approx7392 \text{ [MHz]} \quad (8)$$

The conventional frequency mixer outputs both the sum component and the difference component of the two input frequencies (excluding component of high order). That is, both Fmixo1=7392[MHz] which is the sum component frequency, and Fmixo2=6864[MHz] which is the difference component frequency are outputted at equal level with respect to the above input frequencies.

However, the SSB mixer 31 in the first embodiment is a mixer having a property of outputting only one of either the sum component or the difference component of the two input frequencies (sum component 7392 [MHz] herein). Due to such property, the mixer is referred to as a single side band mixer or an image rejection mixer.

The local oscillator 1 thus outputs F3=7392 [MHz] of the four bands of UWB signal.

The transmitting operation of the UWB signal will be described. The OFDM processing unit 4 generates the transmit base band signal 62 of UWB system based on the transmit data 61 inputted from the communication control unit 11 and outputs the transmit base band signal 62 to the modulator 5 simultaneously with the output of F3=7392 [MHz] from the local oscillator 1. The modulator 5 modulates the F 3=7392 [MHz] as the output (65) of the local oscillator 1 with the transmit base band signal 62, generates the UWB transmit signal, and outputs the UWB transmit signal to the HPA 6. The UWB signal amplified in the HPA 6 is transmitted from the antenna 8 through the transmit/receive switching switch 7.

Further, the receiving operation of the UWB signal will be described. The transmit/receive switching switch 7 is switched to the reception side in the receiving operation, and the UWB modulated signal on 7 GHz band carrier wave is inputted to the LNA 9 from the antenna 8. The mixer 10 mixes the signal from the LNA 9 and the F3=7392 [MHz] as the output (65) of the local oscillator 1, generates the receive base band signal 64, and outputs the signal to the OFDM processing unit 4. The OFDM processing unit 4 performs OFDM inverse transformation on the receive base band signal 64 and outputs the receive data 63.

<Switching from F3 to F2>

Next, an operation of switching the band frequency of UWB from the band center frequency F3=7392 [MHz] to F2=6864 [MHz] will be described.

Fdds=|F2−Fdiv|=|6864−7128|=264[MHz] is obtained from the equation (3). Since the frequency is the same as in F1, Dnco=1703532. If the channel switching signal 152 is switched to L level, the phase switching switch 34 operates to connect the 90 degrees signal 43 of the DDS 30 output to the 270 degrees signal input terminal (fourth input terminal) 74 of the SSB mixer 31, and the 270 degrees signal 44 of the DDS 30 output to the 90 degrees signal input terminal (third input terminal) 73 of the SSB mixer 31. The connection state is referred to as "−sin mode" in the present embodiment.

In −sin mode, other input terminals (72, 73, 74) are each have a phase difference of 180 degrees, 270 degrees, and 90 degrees with respect to the signal phase of the 0 degree signal input terminal 71, as shown in FIG. 2. That is, if the 0 degree signal input terminal 71 is a cosine signal, the 90 degree signal input terminal 73 is a −sine signal.

Therefore, if the phase of the input signal is changed, the sum component and the difference component that appear on the output of the SSB mixer 31 are reversed due to the property of the SSB mixer 31, as described above. In other words, the sum component is changed to the difference component, and thus the output frequency Fssb of the SSB mixer 31 is obtained from an equation (9).

$$Fssb=Fdiv-Fdds=7128\times10^6-263.99989\times10^6=6864.0001\times10^6\approx6864 \text{ [MHz]} \quad (9)$$

Thus, the local oscillator 1 changes the band center frequency of UWB signal from F3=7392 [MHz] to F2=6864 [MHz] and outputs the same.

The frequency switching transition time Tsw at this point is the time period in which the phase switching switch 34 is switched due to change in channel switching signal 152, and thus is shorter than 9.0 [nsec]. Therefore, an equation (10) is satisfied with respect to the frequency hopping transition time Thop=9.0 [nsec] of UWB.

$$Tsw<Thop \quad (10)$$

FIG. 3 shows a signal spectrums of respective sections in the local oscillator circuit 1, and describes the operation of frequency switching. FIG. 3A shows the spectrum of each signal of the output (quadrature phase signal 40) of the DDS 30, FIG. 3B shows the spectrum of each signal of the output (quadrature phase signal 50) of the 1/2 frequency divider 33, and FIG. 3C shows the spectrum of each signal of the output (65) of the SSB mixer 33 and the local oscillator circuit 1. In FIGS. 3A to 3C, F3 output in the normal mode, F2 output in the −sin mode, F4 output in the normal mode, and F1 output in the −sin mode are respectively shown.

In the normal mode, the 264 [MHz] output 301 of the DDS 30 and the 7128 [MHz] output 302 of the 1/2 frequency divider 33 are mixed in the SSB mixer 31, and the 7392 [MHz] output 303 of the SSB mixer 31 is output.

When switched from the normal mode to −sin mode, the 264 [MHz] output 301 of the DDS 30 and the 7128 [MHz] output 302 of the 1/2 frequency divider 33 are mixed in the SSB mixer 31, and the output changes to 6864 [MHz] 305.

<Switching from F3 to F4>

Next, an operation of switching the band frequency of UWB from the band center frequency F3=7392 [MHz] to F4=7920 [MHz] will be described.

Currently, oscillation is performed at F3, and thus the channel switching signal 152 is at H level, and the phase switching switch 34 is in the normal mode.

The first output frequency of the DDS 30 is Fdds=|F4−Fdiv|=|7920−7128|=792 [MHz], as obtained from the equation (3). Furthermore, Dnco=$2^{24}$×792×$10^6$/(2.6×$10^9$)=5110598.105... ≈5110598. The second output frequency of the DDS 30 is Fdds2=(5110598/$2^{24}$)×2.6×$10^9$=791.99998×$10^6$ [Hz]. This means that the setting is made on the target frequency 792 [MHz] with an error of −20 [Hz].

The Dnco (150) is, as the set value on the register, bit [23-0]=010011011111101101000110=8DFB86(H).

When Dnco (150) is set to the accumulator 36, the DDS 30 outputs the set frequency from DACs 37 and 38, that is, from the four output terminals, but the change processing time Tdds from the setting to the output requires about 20 clocks of the master clock (Fmst) 151 when using one example of conventional art.

In this case, if the change processing time Tdds is worth 23 clocks of the master clock (Fmst) 151, the relevant time is obtained from an equation (11), which satisfies the frequency hopping transition time Thop=9.0 [nsec] of UWB.

$$Tdds=23/Fmst=8.84615 \text{ [nsec]} \quad (11)$$

The 792 [MHz] signal output from the DDS 30 is mixed with the output of the 1/2 frequency divider 33 in the SSB mixer 31 via the phase switching switch 34 in the normal mode.

With reference to FIG. 3, the 792 [MHz] output 306 of the DDS 30 is mixed with the 7128 [MHz] output 302 of the 1/2 frequency divider 33, and the local oscillator 1 outputs a 7920 [MHz] output 307.

The frequency hopping transition time at this point is only the switching time period of the phase switching switch 34, and thus is Tsw<Thop, similar to the equation (10). The output frequency is thereby switched from F3=7392 [MHz] to F4=7920 [MHz].

<Switching from F3 to F1>

Next, an operation of switching the band frequency of UWB from the band center frequency F3=7392 [MHz] to F1=6336 [MHz] will be described.

Currently, the output of the DDS 30 is 264 [MHz], but Dnco (150) is set and the output of the DDS 30 is changed to 792 [MHz]. Similar to the above, the change processing time at this point is Tdds=8.84615 [nsec] from the equation (11).

As shown in FIG. 3, the mode must be changed to −sin mode in order to obtain F1=6336 [MHz] (308), and thus the state of the phase switching switch 34 is switched by the channel switching signal 152. The switching control is performed simultaneously with the start of setting of the Dnco (150).

Assuming the switching time of the phase switching switch 34 is Tsw, Tsw<Tdds, and the transition time from F3 to F1, i.e., T3−1 is T3−1=Tdds, T3−1<9.0 [nsec], which satisfies the frequency hopping transition time of UWB.

<Frequency Switching Control>

FIG. 4 shows the correspondence relationship of the data setting operation on the DDS 30 and the switching operation of the phase switching switch 34 in the switching among F1 to F4. In FIG. 4, the horizontal row shows the frequency before switching and the vertical column shows the frequency after switching. The upper section of each field indicates the setting operation on the DDS 30, and the lower section shows the operation of the phase switching switch 34. "Dnco" of the upper section means setting the frequency data, "−" means no operation, "Nom→−Sin" of the lower section indicates switching from the normal mode to the −sin mode, and "−Sin→Nom" means switching from the −sin mode to the normal mode. It is shown that, for frequency hopping from F1 to F3, for instance, the data of the DDS 30 is set, and at the same time, the mode of the phase switching switch 34 must be switched.

In the above described manner, according to the first embodiment, the frequency hopping operation of switching the signal of four bands of UWB among the band center frequencies F1 to F4 at high speed while satisfying 9.0 [nsec] as the high speed frequency hopping transition time is realized.

Second Embodiment

The second embodiment of the present invention will now be described with reference to FIGS. 5 to 7. A radio transceiver of the second embodiment differs from the configuration of the first embodiment in the configuration of the local oscillator circuit 1.

Figure 5:
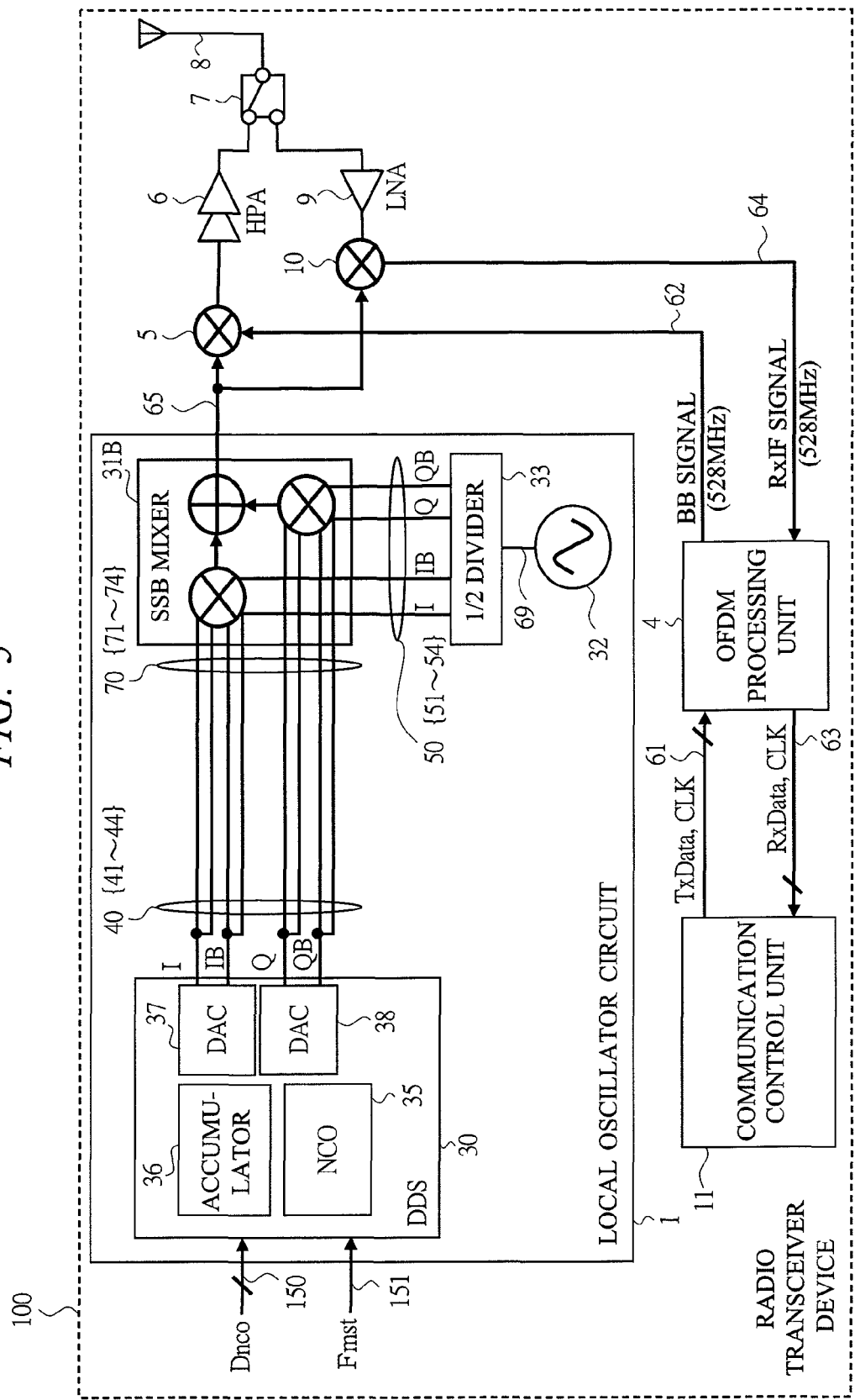
FIG. 5 is a diagram showing a configuration of a radio transceiver according to a second embodiment of the present invention.

FIG. 5 shows the radio transceiver 100 of the second embodiment. The second embodiment has a configuration in which the phase switching switch 34 is removed from the local oscillator circuit 1 of the first embodiment, and the 90 degrees signal 43 and the 270 degrees signal 44 of the outputs (quadrature phase signal 40) of the DDS 30 are respectively connected to the 90 degrees signal input terminal 73 and the 270 degrees signal input terminal 74 of an SSB mixer 31B in the local oscillator circuit 1. The SSB mixer 31 has a configuration and operation different from the SSB mixer 31 of the first embodiment, where the input frequency to the second type of input terminal (50) from the 1/2 frequency divider 33 is outputted as the output frequency from the output terminal of the SSB mixer 31B when a DC voltage is applied to the first type of input terminal 70 (71 to 74) of the SSB mixer 31B.

Figure 7:
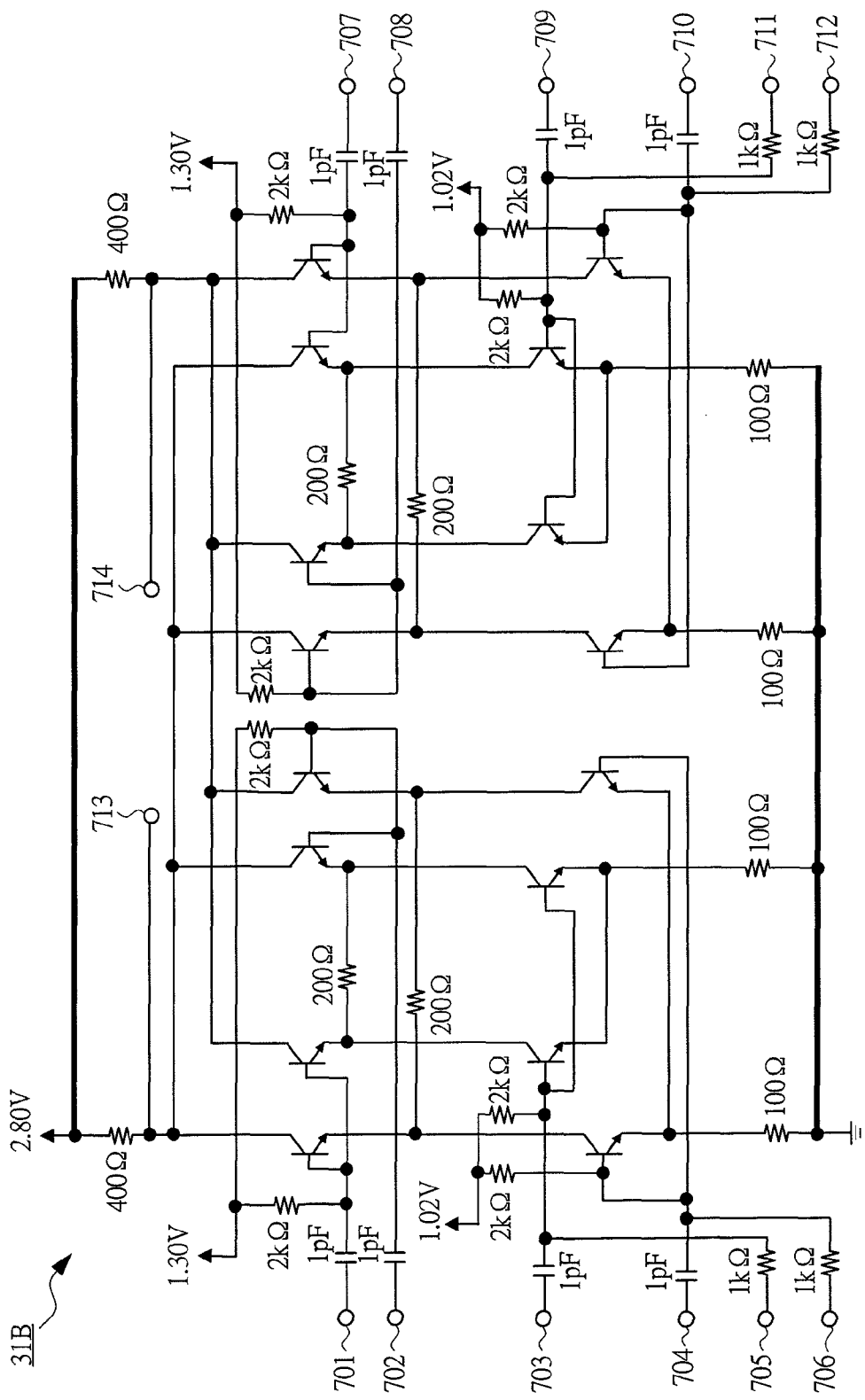
FIG. 7 is a diagram showing a circuit configuration example of the SSB mixer in the radio transceiver of the second embodiment of the present invention.

FIG. 7 shows a configuration example of the SSB mixer 31B. The SSB mixer 31B is configured by combining a plurality of Gilbert mixer circuits using NPN bipolar transistor.

In FIG. 7, a 0 degree signal input terminal 701 (corresponding to 51), a 180 degrees signal input terminal 702 (corresponding to 52), a 90 degrees signal input terminal 707 (corresponding to 53), and a 270 degrees signal input terminal 708 (corresponding to 54) are provided at the second type of input terminal (from 1/2 frequency divider 33 side) of the SSB mixer 31B. A 0 degree signal input terminal 703 (corresponding to 71), a 180 degrees signal input terminal 704 (corresponding to 72), a 90 degrees signal input terminal 709 (corresponding to 73), and a 270 degrees signal input terminal 710 (corresponding to 74) are provided at the first type of input terminal (from DDS 30 side) of the SSB mixer 31B. DC input terminals (705, 706, 711, 712) are provided corresponding to respective input terminals (703, 704, 709, 710) of the first type of input terminal. The SSB mixer 31B also includes output terminals (713, 714).

When the input frequency from the 1/2 frequency divider 33 is outputted, 1.4V is applied to the DC input terminal 705 (=base of input transistor) corresponding to the 0 degree signal input terminal 71, and 0.86V is applied to the DC input terminal 706 (=base of input transistor) corresponding to the 180 degrees signal input terminal 72. And similarly, 1.4V is applied to the DC input terminal 711 corresponding to the 90 degrees signal input terminal 73, and 0.86V is applied to the DC input terminal 712 corresponding to the 270 degrees signal input terminal 74.

Next, an operation in which the second embodiment is applied to will be described where the band center frequency F5=3432 [MHz], F6=3960 [MHz], and F7=4488 [MHz], which are the three bands of 4 GHz band of UWB.

The theoretical relationship between the sampled frequency Fsmp of the DAC 37 and the output signal band Fdac is shown in an equation (12) derived from the sampling theorem.

$$Fdac \leq Fsmp/2 \quad (12)$$

The theoretical value cannot be realized in the actual digital system, and generally, the master clock Fmst and a maximum oscillating frequency Fddsmax in the case of DDS is obtained from an equation (13).

$$Fdds\text{max}=Fmst/2.5 \quad (13)$$

Here, assume that the DDS 30 is desired to be oscillated at Fstep×2=1056 [MHz]. Since Fmst≧1056×2.5≧2640 [MHz] from the equation (13), Fmst=2.7 [GHz] is assumed. The output frequency Fdiv of the 1/2 frequency divider 33 is obtained from an equation (14).

$$Fdiv=\max(Fn)-Fdds=F7-1056=3432 \text{ [MHz]} \quad (14)$$

The output frequency Ffix of the fixed frequency oscillator 32 is Ffix=3432×2=7864 [MHz] from the equation (2). The NCO data (Dnco) 150 is, from the equation (7), Dnco=$2^{Racm}$×Fdds/Fmst=$2^{24}$×10056×$10^6$/(2.7×$10^9$)=6561755.591, where Dnco must be a whole number, and thus Dnco=6561755, and Fdds=(6561755/$2^{24}$)×2.7×$10^9$=1055.9999×$10^6$ [Hz] is obtained from the equation (4). This means that the target frequency 1056 [MHz] is obtained with an error of −100 [Hz].

The output signals (41 to 44) of the DDS 30 are mixed with the output signals (51 to 54) of the 1/2 frequency divider 33 in the SSB mixer 31B, and Fssb=3432+1056=4488 [MHz] (=F7) is obtained from the equation (8).

Next, an operation of switching the output frequency from F7 to F6 will be described.

The output frequency Fdds of the DDS 30 is Fdds=|3960−3432|=528 [MHz]. The NCO data (Dnco) 150 is Dnco=$2^{24}$×528×$10^6$/(2.7×$10^9$)=3280877.796 . . . from the equation (6). Since the Dnco must be a whole number, Dnco3280877 is set, and Fdds=(3280877/$2^{24}$)×2.7×$10^9$=527.99987×$10^6$ [Hz] is obtained from equation (4). This means that the target frequency 528 [MHz] is obtained with an error of −130 [Hz].

FIG. 6 shows signal spectrums of respective sections, and describes the operation of frequency switching. FIG. 6A shows a spectrum of each signal of the output (quadrature phase signal 40) of the DDS 30, FIG. 6B shows a spectrum of each signal of the output (quadrature phase signal 50) of the 1/2 frequency divider 33, and FIG. 6C shows a spectrum of each signal of the output (65) of the SSB mixer 33B and the local oscillator circuit 1. In FIGS. 6A to 6C, F5 output, F6 output, and F7 output are shown in order from the top.

When the local oscillator 1 (SSB mixer 31B) outputs F7=4488 [MHz], the 1056 [MHz] output 603 of the DDS 30 is mixed with the 3432 [MHz] output 604 of the 1/2 frequency divider 33 to obtain 4488 [MHz] output 607. In a switching from F7 to F6, the output of the DDS 30 is changed to 528 [MHz] output 602 and mixed with the 3432 [MHz] output 604 of the 1/2 frequency divider 33 to obtain the 3960 [MHz] output 606.

The frequency transition time is the change processing time Tdds from data setting to the output of the DDS 30, and thus Tdds=23/(2.7×$10^9$)=8.519 [nsec] from the equation (11), which satisfies Thop=9.0 [nsec] as the frequency hopping transition time of the UWB.

Next, an operation of switching the output frequency from F6 to F5 will be described.

Since F5=Fdiv is defined, the output frequency of the SSB mixer 31B is switched to F5=3432 [MHz] if a DC voltage is applied to the first input terminal 70 (71 to 74) due to characteristics and properties of the SSB mixer 31B.

In application of the DC voltage, the first DAC 37 in the DDS 30 outputs a 0 degree signal 41 output signal=1.41V, a 180 degrees signal 42 output signal=0.86V, and the second DAC 38 outputs a 90 degrees signal 43 output signal=1.41V and a 270 degrees signal 44 output signal=0.86V.

The operation of frequency switching will be described according to the signal spectrum of FIG. 6, where the output of the DDS 30 that has outputted 528 [MHz] is changed to a DC voltage (601). Thus, the output of the local oscillator 1 becomes 3432 [MHz] output 605 (=F5).

The frequency transition time is the change processing time Tdds from the control on DACs 37, 38 to the output of the DDS 30, and thus Tdds=23/(2.7×$10^9$)=8.519 [nsec] is obtained from the equation (11), which satisfies Thop=9.0 [nsec] as the frequency hopping transition time of the UWB.

Therefore, the frequency hopping operation for switching the signal of three bands of UWB among the band center frequencies F5 to F7 at high speed while satisfying the condition of 9.0 [nsec] as the high speed frequency hopping transition time is realized according to the second embodiment, similar to the first embodiment.

Third Embodiment

Next, a third embodiment of the present invention will be described with reference to FIGS. 8 and 9. A radio transceiver of the third embodiment is a device (complex communication device) having a radio transmission/reception function corresponding to UWB system and WCDMA system, and a frequency hopping communication function (shared by UWB system and WCDMA system), whereby UWB system communication is realized in addition to the WCDMA system mobile communication. A so-called seamless communication is realized by the relevant device in which while a mobile communication service is established by the WCDMA system outdoors, a switching to the radio communication by the UWB method can be made when moving to indoors, without disconnecting the service. Although the configuration based on the second embodiment is shown in the third embodiment, the configuration based on the first embodiment is also possible.

Figure 8:
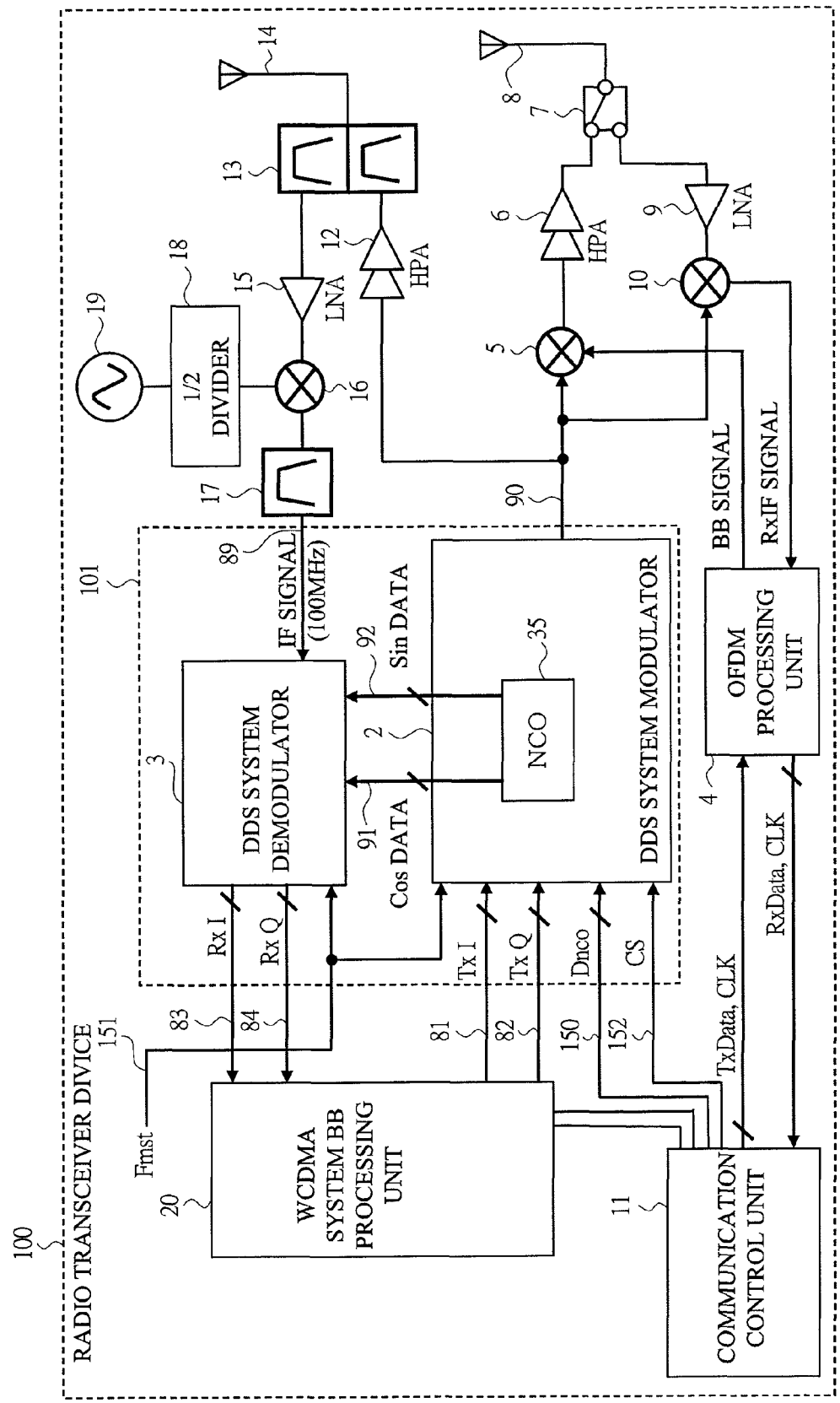
FIG. 8 is a diagram showing a configuration of a radio transceiver in a third embodiment of the present invention.

FIG. 8 shows the radio transceiver (communication device) 100 of the third embodiment. The radio transceiver 100 includes a frequency hopping communication IC (101) corresponding to the UWB system and the WCDMA system as a distinctive circuit. A portion of the circuit including the DDS system modulator 2 and the DDS system demodulator 3 is mounted as one frequency hopping communication IC (101).

In the configuration of FIG. 8, a DDS (DDS system) modulator 2, a DDS (DDS system) demodulator 3, the communication control unit (communication processing unit) 11, a WCDMA system base band processing unit (abbreviated as BB unit) 20, a WCDMA system high power amplifier (HPA) 12, a transceiver duplexer 13, an antenna 14, a low noise amplifier (LNA) 15, a mixer 16, a band pass filter (BPF) 17, a 1/2 frequency divider 18, a VCO (Voltage Control Oscillator) 19 and the like are arranged, different from the configuration of the first embodiment of FIG. 1. The DDS modulator 2 and the DDS demodulator 3 are arranged in place of the local oscillator circuit 1.

The signal/data includes a transmit I signal (TxI) 81, a transmit Q signal (TxQ) 82, a receive I signal (RxI) 83, a receive Q signal (RxQ) 84, a reception IF (Intermediate Frequency) signal 89, a transmit signal 90, cosine data 91, and sine data 92. Similar to the above embodiments, the signal/ data includes NCO data (Dnco) 150, master clock (Fmst) 151, channel switching signal (CS) 152 and the like.

In a transmission of WCDMA system, the communication control unit 11 controls the BB unit 20, so that the BB unit 20 outputs the transmit I signal and the transmit Q signal of WCDMA system to the DDS modulator 2, and sets the NCO data (Dnco) 150 to the DDS modulator 2. The NCO 35 outputs the cosine data 91 and the sine data 92 (amplitude data of the frequency based on frequency setting parameters) generated from the NCO data 150 to the DDS demodulator 3. The DDS modulator 2 outputs the transmit signal 90 modulated in WCDMA system to the HPA 12. The transmit signal amplified in the HPA 12 is band-limited by the transceiver duplexer 13, and transmitted from the antenna 14.

Figure 9:
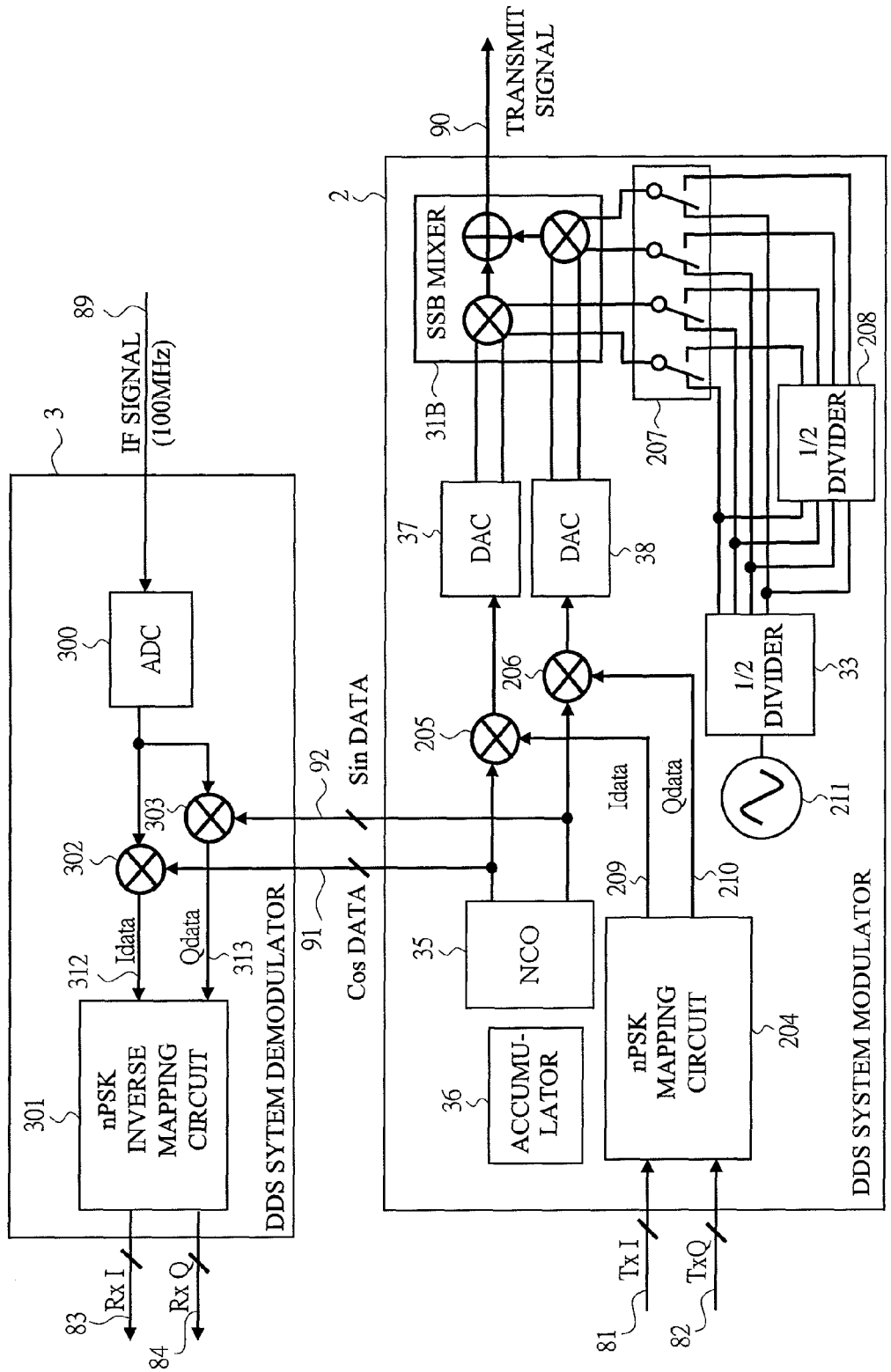
FIG. 9 is a diagram showing a configuration of a DDS modulator and a DDS demodulator in the radio transceiver of the third embodiment.

FIG. 9 shows a configuration of the DDS modulator 2 and the DDS demodulator 3, and describes the modulating operation in the DDS modulator 2. In FIG. 9, the DDS modulator 2 includes the SSB mixer 31B, the 1/2 frequency divider 33, the NCO 35, the accumulator 36, the DACs 37 and 38 etc., similar to the above embodiments. But, it differs from the above embodiments in that an n-phase PSK symbol (nPSK) mapping circuit 204, digital modulators 205 and 206, a 2/4 frequency dividing switch 207, a 1/2 frequency divider 208, a frequency synthesizer 211 and the like are arranged. The data/signal includes I-axis data Idata[m:0] 209, Q-axis data Qdata[m:0] 210 etc. The "n" of the n-phase PSK takes a value of 4, 8, 16, . . . .

The 2/4 frequency dividing switch 207, the 1/2 frequency divider 208 etc. are arranged as a frequency switching circuit for switching the output of the fixed frequency oscillator 211 by the control signal to output to the second type of input terminal of the SSB mixer 31B.

The DDS demodulator 3 includes an ADC 300, digital demodulators 302 and 303, an n-phase PSK symbol (nPSK) inverse mapping circuit 301 and the like. The data/signal includes I-axis data Idata[m:0] 312, Q-axis data Qdata[m:0] 313 etc.

In the expression of I-axis data Idata[m:0] 209 and the like, when n=4 (i.e., four-phase PSK), Idata[m:0]=Idata[1:0]={Idata[1], Idata[0]}. Furthermore, when n=8 (i.e., eight-phase PSK), Idata[m:0]=Idata[2:0]={Idata[2], Idata[1], Idata[0]}.

In the WCDMA system, the code spread transmit data S is divided into a real number signal Re{S} and an imaginary number signal Im{S}, and a QPSK modulation shown in equations (15) and (16) is performed.

$$Re\{S\} \times \cos(\omega t) \quad (15)$$

$$Im\{S\} \times \sin(\omega t) \quad (16)$$

The nPSK mapping circuit 304 having the TxI input terminal input with the Re{S}×cos (ωt) or the transmit I signal (TxI) 81 and the TxQ input terminal input with the Im{S}×sin (ωt) or the transmit Q signal (TxQ) outputs the I-axis data Idata[m:0] 209 and the Q-axis data Qdata[m:0] 210 corresponding to the QPSK phase plane.

The first digital modulator 205 multiples the cosine data 91 as the carrier wave data from the NCO 35 and the I-axis data Idata[m:0] 209 to generate modulated cosine data modulated with the I-axis data Idata[m:0] 209. This data becomes the I-IB signal by the first DAC 37. Similarly, the second digital modulator 206 generates modulated sine data from the sine data 92 and the Q-axis data Qdata[m:0] 210, which becomes the Q-QB signal by the second DAC 38. The outputs (I-IB signal, Q-QB signal) of the DACs 37 and 38 are inputted to the first type of input terminal of the SSB mixer 31B.

The second type of input terminal of the SSB mixer 31B is connected to the 1/2 frequency divider 208 side by way of the 2/4 frequency dividing switch 207 in WCMDA communication. The output frequency Fdiv4 of the 1/2 frequency divider 208 is Fdiv4=1950 [MHz] and is obtained as shown in an equation (17) when assumed as mid-CH (middle channel) of band 1 frequency used in the WCDMA system.

$$Fdiv = Fdiv4 \times 2 = 1950 \times 2 = 3900 \text{ [MHz]} \quad (17)$$

An output frequency Fsyn of the frequency synthesizer 211 is as shown in an equation (18).

$$Fsyn = Fdiv \times 2 = 3900 \times 2 = 7800 \text{ [MHz]} \quad (18)$$

The SSB mixer 31B mixes the I-IB signal and the Q-QB signal, and the output signal of the 1/2 frequency divider 208 to generate and output the transmit signal 90 as the WCDMA modulated wave having a carrier wave of 1950 [MHz]. The transmitting operation of the WCDMA communication is thereby achieved.

Next, the receiving operation of the WCDMA communication will be described. In FIG. 8, the reception signal inputted through the transceiver duplexer 13 from the antenna 14 is amplified by the LNA 15 and inputted to the mixer 16. An output frequency Frxdiv of the 1/2 frequency divider 18 based on the VCO 19 is obtained by an equation (19) assuming the receiving channel as the mid-CH=2140 [MHz] of the band 1 frequency of WCDMA.

$$Frxdiv = 2140 - Fif = 2140 - 100 = 2040 \text{ [MHz]} \quad (19)$$

The mixer 16 outputs a signal of 100 [MHz], which is then band-limited by the BPF 17 to generate the IF signal 89, and the IF signal 89 is inputted to the DDS demodulator 3.

In FIG. 9, the ADC 300 of the DDS demodulator 3 converts the IF signal 89 to a digital signal, and outputs the digital signal to the digital demodulators 302 and 303. The first digital demodulator 302 multiples the first input digital signal and the cosine data 91 from the DDS modulator 2, and generates the I-axis data Idata[m:0] 312. Similarly, the second digital demodulator 303 multiples the second input digital signal and the sine data 92 from the DDS modulator 2, and generates the Q-axis data Qdata[m:0] 313.

The nPSK inverse mapping circuit 301 performs an inverse conversion of the conversion in the nPSK mapping circuit 204, that is, corresponds the I-axis Idata[m:0] 312 to the QPSK phase plane, and outputs the Re{S}×cos (ωt) as the receive I signal 83. Similarly, the Im{s}×sin (ωt) or the receive Q signal 84 is outputted from the Q-axis data Qdata[m:0] 313.

The receive I signal 83 and the receive Q signal 84 are caused to reverse diffusion process performed by the BB unit 20, and the communication control unit 11 acquires the receive data.

Next, an operation of switching from the WCDMA communication to the UWB communication by the radio transceiver of the third embodiment will be described with reference to FIG. 8. The radio property specification and the Layer 1 specification of the WCDMA system are defined in Non-patent Documents 2 and 3.

In the WCDMA system, a function of compressed mode for receiving signals of other frequency bands that are not the reception frequency band itself is provided. In the compressed mode, a transmission gap as a no-signal period is created in a downward signal from the base station to the radio transceiver, and other frequencies are monitored and received during the relevant period.

In the third embodiment, in this case, the communication control unit 11 turns OFF the LNA 15 and the HPA 12, switches the transmit/receive switching switch 7 to the reception side, and operates the OFDM processing unit 4. Furthermore, the communication control unit 11 sets the NCO data 150 to the DDS system modulator 2, and the transmit signal 90 is outputted at the F6=3960 [MHz] as the band center frequency. Details of the operation are as described in the second embodiment.

In this case, the 2/4 frequency dividing switch 207 is connected to the 1/2 frequency divider 33 side, as shown in FIG. 9, and the output frequency Fsyn of the frequency synthesizer 211 is set to the frequency determined by an equation (20).

$$Fsyn=Fdiv \times 2=3432 \times 2=6864 \text{ [MHz]} \qquad (20)$$

Therefore, the UWB signal can be received, and thus the WCDMA communication can be switched to the UWB communication. The WCDMA system has been described by way of example in the third embodiment, but other radio communication systems such as CDMA system, TDMA system, and FDMA system are also applicable.

Therefore, according to the third embodiment, the frequency hopping operation for switching the signals of the UWB system at high speed is realized, similar to the first and second embodiments, and the communication of the WCDMA system serving as another radio communication system is also realized using the operation of the shared circuit (DDS modulator 2).

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is applicable to the radio frequency LSI (RFIC) and communication devices and systems thereof, used in a wireless LAN system that enables high speed transmission and in a complex system of wireless LAN and mobile communications device.

What is claimed is:

1. A frequency hopping communication IC comprising:
   a direct digital synthesizer for outputting first quadrature phase signals of 0 degree, 90 degrees, 180 degrees, and 270 degrees, whose phases differ from each other at least by 90 degrees, at a frequency based on a frequency setting parameter in synchronization with a reference clock;
   a fixed frequency oscillator for outputting second quadrature phase signals of 0 degree, 90 degrees, 180 degrees, and 270 degrees, whose phases differ from each other by 90 degrees; and
   a single side band mixer having an RF input to which the first quadrature phase signals are inputted and a local oscillation signal input terminal to which the second quadrature phase signals are inputted, for outputting either one of a sum component frequency or a difference component frequency to an output terminal;
   wherein an operation of switching an output frequency of the single side band mixer is performed by an operation of switching an output frequency of the direct digital synthesizer.

2. The frequency hopping communication IC according to claim 1, comprising:
   a phase switching unit arranged between the direct digital synthesizer and the single side band mixer for switching a signal phase so as to output the 90 degrees signal of the first quadrature phase signals of the output of the direct digital synthesizer to the 270 degrees signal input terminal of the RF input of the single side band mixer, and, switching the 270 degrees signal of the first quadrature phase signals of the output of the direct digital synthesizer to the 90 degrees signal input terminal of the RF input of the single side band mixer;
   wherein, when switching the output frequency of the single side band mixer, the output frequency of the single side band mixer is switched from the sum component frequency to the difference component frequency or from the difference component frequency to the sum component frequency by switching the signal phase by the phase switching unit.

3. The frequency hopping communication IC according to claim 2,
   wherein, when N bands of band center frequencies F1 to FN are provided as usable frequencies, and an interval of the band center frequencies F is Fstep,
   if N=even number,
     a frequency Ffix of the fixed frequency oscillator is Ffix=Σ(Fn)/N,
     the output frequency Fdds of the direct digital synthesizer is Fdds=1/2×Fstep+m×Fstep (m=0, 1, . . . , N/2−1);
   if N=odd number,
     the frequency Ffix of the fixed frequency oscillator is Ffix=Σ(Fn)/N−Fstep,
     the output frequency Fdds of the direct digital synthesizer is Fdds=1/2×Fstep+m×Fstep (m=1, . . . , (N−1)/2); and
   the output frequency of the single side band mixer is switched by switching the output frequency of the direct digital synthesizer and simultaneously switching the signal phase by the phase switching unit.

4. The frequency hopping communication IC according to claim 1,
   wherein the single side band mixer operates to output the output frequency of the fixed frequency oscillator from the output terminal when the output of the direct digital synthesizer is direct current;
   when N bands of band center frequencies F1 to FN are provided as usable frequencies, and an interval of the band center frequency F is Fstep,
     the frequency Ffix of the fixed frequency oscillator is Ffix=F1, and
     the output frequency Fdds of the direct digital synthesizer is Fdds=0 [Hz] (N=1), Fdds=N×Fstep (N≠1); and
   the output frequency of the single side band mixer is switched by switching the output frequency of the direct digital synthesizer.

5. A frequency hopping communication IC having a communication function of frequency hopping system of ultra wide band signal, and a communication function of division multiple access system of one of TDMA, FDMA, and CDMA;
   the frequency hopping communication IC comprising:
   a numeral controlled oscillator which outputs amplitude data of a frequency based on a frequency setting parameter in synchronization with a reference clock;
   a single side band mixer having both an RF input and a local oscillating input terminal to which quadrature phase signals of 0 degree, 90 degrees, 180 degrees, and 270 degrees which phases differ from each other at least by 90 degrees are inputted, and outputs only either one of a sum component frequency or a difference component frequency to an output terminal;

a fixed frequency oscillator which outputs a second quadrature phase signal to the local oscillation signal input terminal of the single side band mixer;

an n-phase mapping circuit which converts an n-phase modulated I signal and a Q signal to I data and Q data for modulating an output of the numeral controlled oscillator;

a digital modulator which modulates the output of the numeral controlled oscillator with the I data and the Q data outputted by the n-phase mapping circuit;

a D/A converter which converts an output of digital signal from the digital modulator to an analog signal, and outputs the signal to the RF input of the single side band mixer as a first quadrature phase signal;

an A/D converter which samples an input signal;

a digital demodulator which demodulates an output of the A/D converter with the output of the numeral controlled oscillator;

an n-phase inverse mapping circuit for converting the I data and the Q data outputted by the digital demodulator to n-phase modulated I signal and Q signal; and a frequency switching circuit which switches the output of the fixed frequency oscillator by a control signal to output to the local oscillation signal input terminal of the single side band mixer;

wherein, in reception of the communication of division multiple access system, the frequency of the numeral controlled oscillator is set, the signal at the division multiple access system is sampled by the A/D converter, the sampled signal is mixed with the output of the numeral controlled oscillator and demodulated by the digital demodulator, and the demodulated I data and the Q data are inverse-mapped to the n-phase modulated I signal and Q signal by the n-phase mapping circuit;

in transmission of the communication of division multiple access system, the modulated signal in the division multiple access system is mapped to the I data and the Q data by the n-phase mapping circuit, the output of the numeral controlled oscillator is modulated with the I data and the Q data by the digital modulator, the modulated digital signal is converted to the analog signal by the D/A converter, and the converted signal is mixed with the output signal of the fixed frequency oscillator and outputted by the single side band mixer; and in switching from the communication of division multiple access system to the communication of frequency hopping system, the frequency of the fixed frequency oscillator is set, the frequency is switched by the frequency switching circuit, and the output frequency of the numeral controlled oscillator is switched to switch the output frequency of the single side band converter.

6. The frequency hopping communication IC according to claim 5, comprising:

a phase switching unit arranged between the D/A converter and the single side band mixer, for switching a signal phase so as to output the 90 degrees signal of the D/A converter to the 270 degrees signal input terminal of the single side band mixer, and the 270 degrees signal of the D/A converter to the 90 degrees signal input terminal of the single side band mixer; and when switching the output frequency of the single side band mixer, the output frequency of the single side band mixer is switched from a sum component frequency to a difference component frequency or, inversely, from the difference component frequency to the sum component frequency by switching the signal phase by the phase switching unit.

7. The frequency hopping communication IC according to claim 6, wherein, when N bands of band center frequency F1 to FN are provided as usable frequencies, and an interval of the band center frequency F is Fstep, if N=even number,
the frequency Ffix of the fixed frequency oscillator is Ffix=Σ(Fn)/N,
the output frequency Fdds of the numeral controlled oscillator is Fdds=1/2 ×Fstep+m×Fstep (m=0, 1, ..., N/2−1);

if N=odd number,
the frequency Ffix of the fixed frequency oscillator is Ffix=Σ(Fn)/N−Fstep,
the output frequency Fdds of the numeral controlled oscillator is Fdds=1/2×Fstep+m×Fstep (m=1, ..., (N−1)/2); and the output frequency of the single side band mixer is switched by switching the output frequency of the numeral controlled oscillator and simultaneously switching the signal phase by the phase switching unit.

8. The frequency hopping communication IC according to claim 5, wherein the single side band mixer operates to output the frequency of the fixed frequency oscillator from the output terminal when the output of the D/A converter is direct current;

when N bands of band center frequency F1 to FN are provided as usable frequencies, and an interval of the band center frequency is Fstep, the frequency Ffix of the fixed frequency oscillator is Ffix=F1;

the output frequency Fdds is Fdds=0 [Hz] (N=1), Fdds=N×Fstep (N≠1); and the output frequency of the single side band mixer is switched by switching the output frequency of the numeral controlled oscillator.

* * * * *